US008934237B2

(12) United States Patent
Cheng

(10) Patent No.: US 8,934,237 B2
(45) Date of Patent: Jan. 13, 2015

(54) PORTABLE ELECTRONIC DEVICE

(75) Inventor: Chia-Min Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 465 days.

(21) Appl. No.: 13/323,990

(22) Filed: Dec. 13, 2011

(65) Prior Publication Data

US 2013/0107427 A1    May 2, 2013

(30) Foreign Application Priority Data

Oct. 28, 2011    (TW) .............................. 100139428 A

(51) Int. Cl.
| H05K 5/00 | (2006.01) |
| H05K 7/00 | (2006.01) |
| G11B 33/02 | (2006.01) |
| A47G 1/10 | (2006.01) |
| E04G 3/00 | (2006.01) |
| A47B 96/06 | (2006.01) |
| G06F 1/16 | (2006.01) |

(52) U.S. Cl.
CPC ............... H05K 7/00 (2013.01); G06F 1/1626 (2013.01); G06F 1/166 (2013.01)
USPC ............ 361/679.55; 361/679.09; 361/679.06; 361/679.07; 361/679.41; 369/79; 248/316.5; 248/292.14; 292/8; 292/4

(58) Field of Classification Search
USPC .............................. 361/679.3, 679.55–679.59, 361/679.01–679.09, 679.1–679.19, 361/679.21–679.29, 679.31–679.45, 361/679.55–679.6, 724–747; 455/325, 455/556.1, 550.1, 90.1, 575.1; 345/156, 345/157, 168, 169, 184; 369/75.1, 75.2, 369/75.11, 75.21, 76, 77.11, 77.21, 78, 79, 369/80, 81, 82; 248/80–88, 155.1–155.5, 248/166–173, 180.1–186.2, 229.1–231.51, 248/271.4, 292.14, 316.1–316.8; 292/1–62, 292/113, 169.11–169.23, 341.11–341.19
See application file for complete search history.

(56) References Cited

U.S. PATENT DOCUMENTS

| 7,299,580 B2* | 11/2007 | Wang et al. ..................... 40/719 |
| 8,162,283 B1* | 4/2012 | Royz et al. ..................... 248/455 |
| 2006/0050471 A1* | 3/2006 | Chen ............................. 361/681 |

* cited by examiner

Primary Examiner — Jerry Wu
(74) Attorney, Agent, or Firm — WPAT, PC; Justin King

(57) ABSTRACT

A portable electronic device includes a body and a support structure. The support structure pivotally connected to the body includes a first structural member and a second structural member, and the first structural member is pivotally connected to the body along a first axis. The second structural member pivotally connected to the first structural member along a second axis includes a first support region and a second support region. The combination of the first structural member and the second structural member rotates around the first axis towards or away from the body, and when it rotates away from the body, the first support region leans against a first support surface. The second structural member rotates around the second axis towards or away from the body, and when it rotates away from the body, the second support region leans against the support surface.

10 Claims, 4 Drawing Sheets

PORTABLE ELECTRONIC DEVICE

This application claims the benefit of Taiwan application Serial No. 100139428, filed Oct. 28, 2011, the subject matter of which is incorporated herein by reference.

BACKGROUND OF THE INVENTION

1. Field of the Invention

The invention relates in general to a portable electronic device, and particularly a portable electronic device having a support structure.

2. Description of the Related Art

Tablet personal computers have become more widely used and more popular, and there have been a variety of choices of weights and sizes provided for tablet personal computers. Due to the convenience of portability, users can use tablet personal computers when commuting and in many other situations. Further, tablet personal computers have big-sized display panels, hence, they can be used as digital photo frames. However, most current tablet personal computers are not equipped with structures for supporting the tablet personal computers. Hence, it is inconvenient when using tablet personal computers as digital photo frames. Therefore, providing a tablet personal computer with a supporting stand is one of the important issues in industry.

SUMMARY OF THE INVENTION

The invention is directed to a portable electronic device having a support structure, wherein the combination of the first structural member and the second structural member rotates around the first axis with respect to the body, and the second structural member rotates around the second axis with respect to the body, such that the portable electronic device may have two supporting conditions via one support structure.

The portable electronic device includes a body and a support structure. The support structure pivotally connected to the body includes a first structural member and a second structural member, and the first structural member is pivotally connected to the body along a first axis. The second structural member pivotally connected to the first structural member along a second axis includes a first support region and a second support region. The combination of the first structural member and the second structural member rotates around the first axis towards or away from the body, and the second structural member rotates around the second axis towards or away from the body. When the combination of the first structural member and the second structural member rotates around the first axis away from the body, the first support region leans against a support surface. When the second structural member rotates around the second axis away from the body, the second support region leans against the support surface.

DETAILED DESCRIPTION OF THE INVENTION

The above and other technical contents, characteristics and effects of the invention will be illustrated with regard to the following detailed description.

Figure 1A:
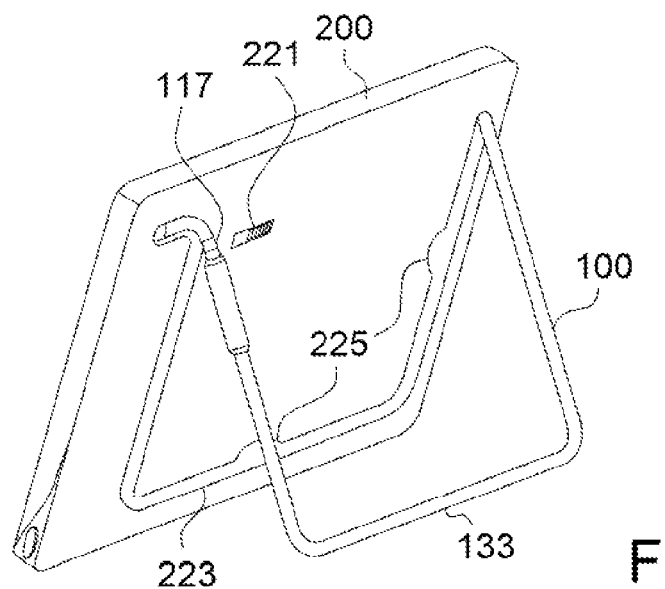
FIG. 1A and FIG. 1B are perspective views of an example of the portable electronic device of the invention.
Figure 1B:
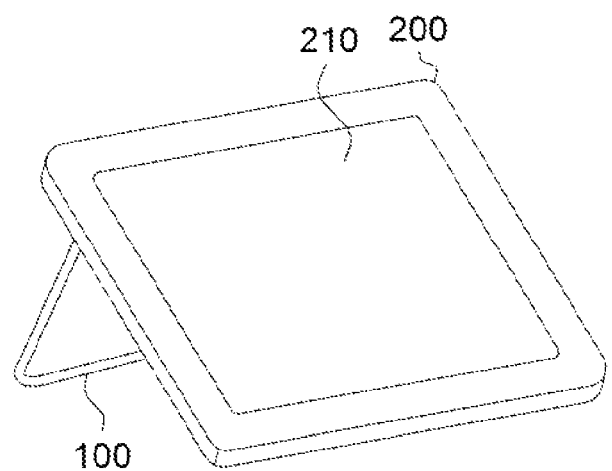

FIGS. 1A and 1B are perspective views of an example of the portable electronic device of the invention. The portable electronic device 10 includes a body 200 and a support structure 100. The portable electronic device 10 further includes a display panel 210 disposed on a side of the body 200, and the support structure 100 is disposed on the other side of the body 200. The portable electronic device 10 can be a tablet personal computer, and the support structure 100 can be a supporting stand of the tablet personal computer. However, the portable electronic device 10 can be other types of portable electronic device as well.

Figure 2:
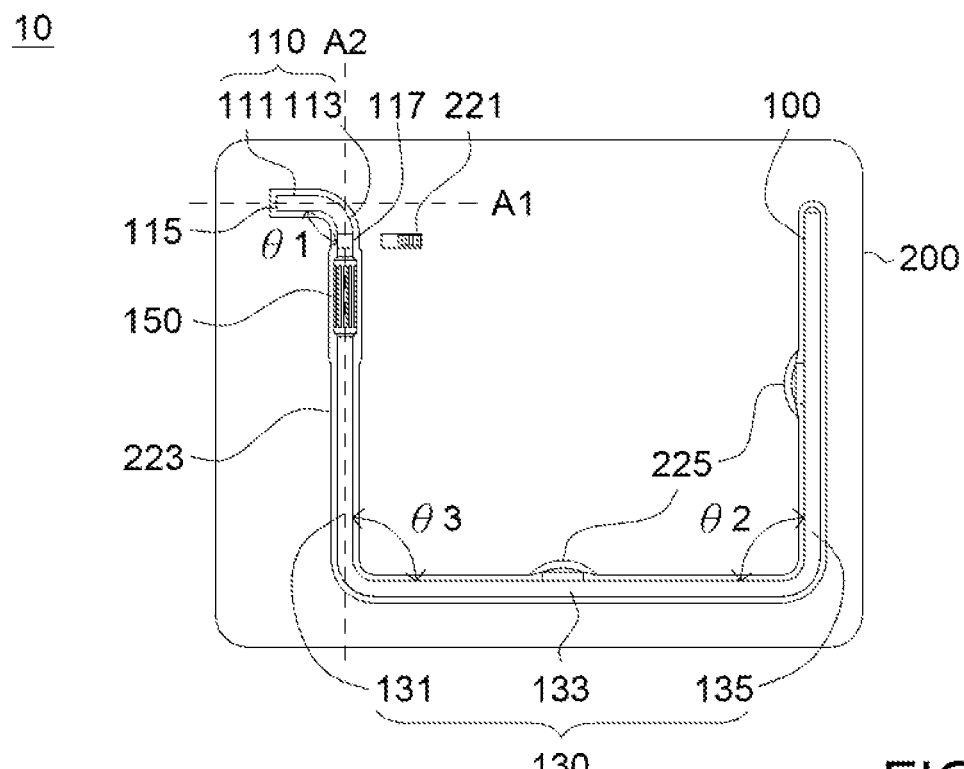
FIG. 2 is perspective view of the support structure and the portable electronic device having the support structure of the invention.

FIG. 2 is perspective view of the support structure and the portable electronic device having the support structure of the invention. The support structure 100 pivotally connected to the body 200 of the portable electronic device 10 includes a first structural member 110 and a second structural member 130. The first structural member 110 is pivotally connected to the body 200 along a first axis A1. The second structural member 130 is pivotally connected to the first structural member 110 along the second axis A2 and includes a first support region 133 and a second support region 135. The first support region 133 is pivotally connected to the first structural member 110, and the second support region 135 is connected to the first support region 133. There is a first angle θ2 between the extending direction of the second support region 135 and the extending direction of the first support region 133. Preferably, the first angle θ2 is substantially 90 degrees. In the example, the extending direction of the first support region 133 is substantially parallel to the first axis A1, and the extending direction of the second support region 135 is substantially parallel to the second axis A2. The second structural member 130 is preferably U-shaped.

The first structural member 110 further includes a fastening region 117, and the body 200 further includes a fastening component 221. The fastening component 221 engages with the fastening region 117 to restrict the first structural member 110 from rotating along the first axis A1 with respect to the body 200. In addition, the body 200 further has a recess 223 for containing the support structure 100, and the support structure 100 is pivotally connected to an inner side of the recess 223. The fastening component 221 may be disposed in the body 200 as well, and selectively penetrates an inner side wall of the recess 223 to engage with the fastening region 117 for fixing the first structural member 110 in the recess 223. As a result, the fastening component 221 is not extruded from the body 200, and the surface of the body 200 remains flat, which makes the placement convenient and a good external appearance.

The first structural member 110 further includes a first axial region 111 and a second axial region 113. The first axial region 111 has an end 115 pivotally connected to the body 200, the other end of the first axial region 111 is connected to an end of the second axial region 133, and the other end of the second axial region 133 is connected to the second structural member 130. There is an angle θ1 between the first axial region 111 and the second axial region 113, and preferably, the angle θ1 is substantially 90 degrees. In the example, the first axial region 111 rotates around the first axis A1, and the extending direction of the second axial region 113 is substantially the same with the second axis A2.

The second structural member 130 further includes a connection region 131 pivotally connected to the first structural member 110. There is a second angle θ3 between the extending direction of the connection region 131 and the extending direction of the first support region. Preferably, the second angle θ3 is substantially 90 degrees. In the example, the extending direction of the connection region 131 is substantially parallel to the extending direction of the second support region 135.

The support structure 100 further includes a connector 150, and the second structural member 130 is pivotally connected to the first structural member 110 via the connector 150. In the example, the end 115 of the first axial region 111 is pivotally connected to an inner side of the recess 223 of the body 200. The body 200 further has at least a recessing region 225, and the recessing region 225 is connected to the recess 223. In the example, the body 200 has, such as, two recessing regions 225. Preferably, the two recessing regions 225 are formed beside the first support region 133 and the second support region 135, respectively.

Figure 3A:
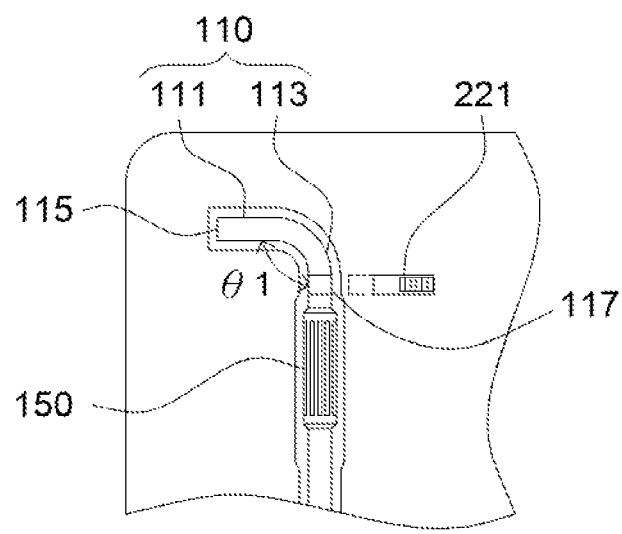
FIG. 3A and FIG. 3B are perspective views of the fastening region and the fastening component according to FIG. 2 in different conditions.
Figure 3B:
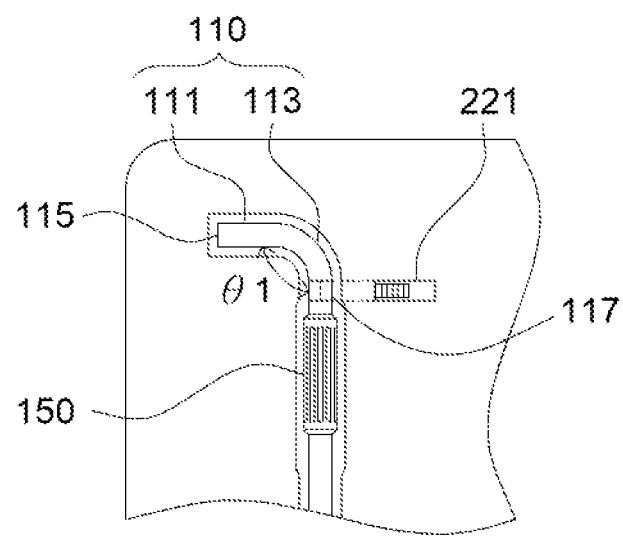

FIG. 3A and FIG. 3B are perspective views of the fastening region and the fastening component according to FIG. 2 in different conditions. In one condition, as shown in FIG. 3A, the fastening component 221 has not penetrated the inner side wall of the recess 223, and the fastening component 221 has not engaged with the fastening region 117, as such, the first structural member 110 is not fixed in the recess 223. As for in another condition, as shown in FIG. 3B, the fastening component 221 penetrates the inner side wall of recess 223, such that the fastening component 221 engages with the fastening region 117, and the first structural member 110 is fixed in the recess 223.

Figure 4A:
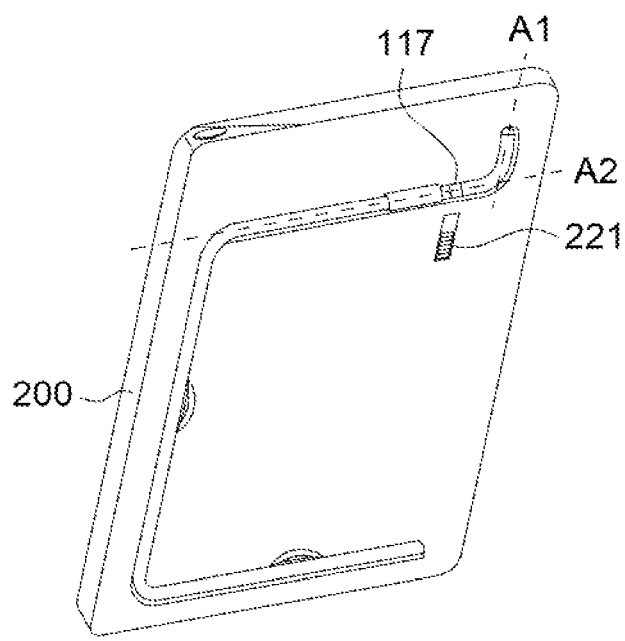
FIGS. 4A-4C are perspective views of the support structure in different supporting conditions, respectively.
Figure 4B:
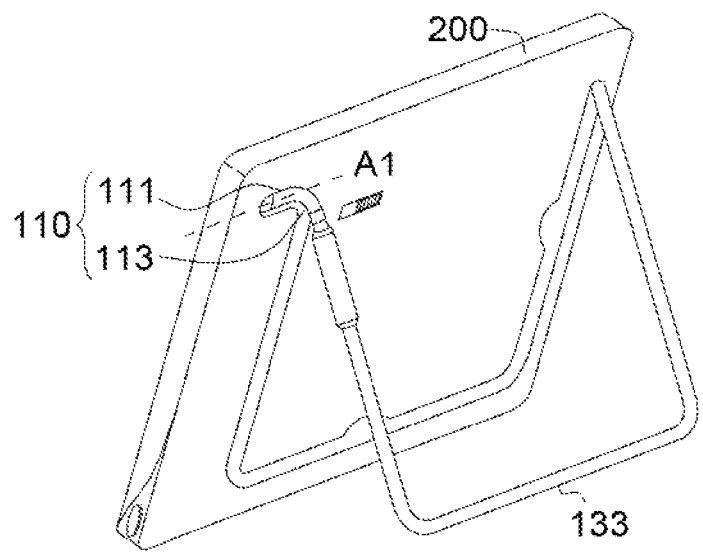
Figure 4C:
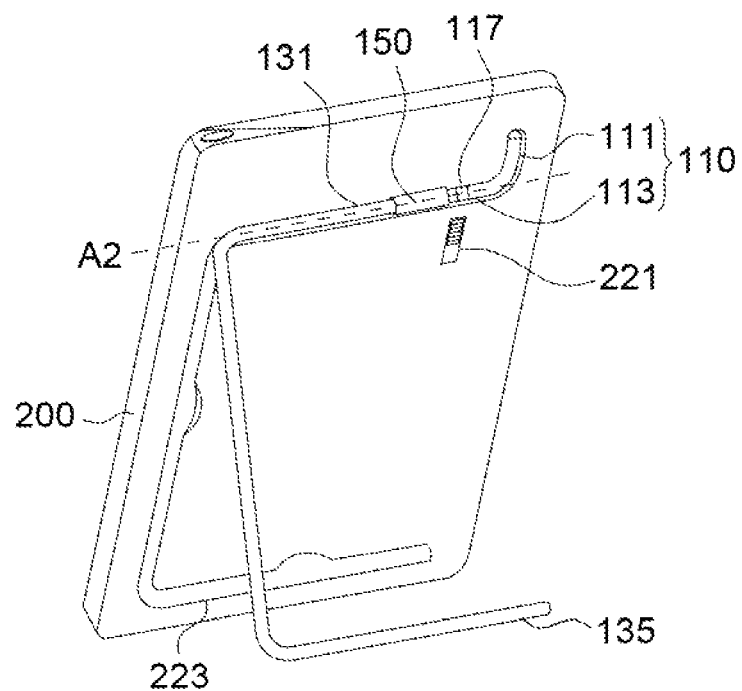

FIGS. 4A-4C are perspective views of the support structure in different supporting conditions, respectively. As shown in FIG. 4A, the support structure 100 is disposed adjacent to the surface of the body 200, and hence a storage condition is provided. In the storage condition, the first structural member 110 and the second structural member 130 do not rotate with respect to the body 200. In addition, the support structure 100 is contained in the recess 223, preferably, the whole support structure 100 is contained in the recess 223 and not extruded from the surface of the body 20. As such, the support structure 100 is not extruded from the body 200, and the surface of the body 200 remains flat, which makes the placement convenient. When a user does not require the tablet personal computer to be supported by a stand, the support structure 100 is in the storage condition, such that the tablet personal computer can be easily carried and stored by a user.

As shown in FIG. 4B, the combination of the first structural member 110 and the second structural member 130 can rotate around the first axis A1 towards or away from the body 200. When the combination of the first structural member 110 and the second structural member 130 rotates around the first axis A1 away from the body 200, the first support region 133 leans against a support surface, and the support structure 110 provides a first supporting condition. Further, the combination of the first structural member 110 and the second structural member 130 rotates around the first axial region 111 away from the body 200, and the storage condition is transformed into the first supporting condition. In the first supporting condition, the first structural member 110 is not fixed in the recess 223, and the support structure 100 leans against on the support surface via the first support region 133 to support the body 200. In the first supporting condition, a user can use the support structure 100 as a lateral supporting stand of a tablet personal computer, and then watches the display panel and uses the tablet personal computer in a lateral manner.

As shown in FIG. 4C, the second structural member 130 can rotate around the second axis A2 towards or away from the body 200. When the second structural member 130 rotates around the second axis A2 away from the body 200, the second support region 135 leans against on the support surface, and the support structure 100 provides a second supporting condition. Further, the second structural member 130 rotates around the second axial region 113 away from the body 200, and the storage condition is transformed into the second supporting condition. In the second supporting condition, the first structural member 110 is disposed adjacent to the surface of the body 200, the first structural member 110 is fixed on the body 200, and the support structure 100 leans against on the support surface via the second support region 135 to support the body 200. In the example, the connection region 131 rotates around the second axial region 113, and preferably, the connection region 131 is pivotally connected to the first structural member 110 via the connector 150. In addition, the first structural member 110 is contained in the recess 223, preferably, the whole first structural member 110 is contained in the recess 223 and not extruded from the surface of the body 200. The first structural member 110 is fixed on the recess 223 via the fastening component 221. In the second supporting condition, a user can use the support structure 100 as a vertical supporting stand of a tablet personal computer, and then watches the display panel and uses the tablet personal computer in a vertical manner.

Moreover, when the support structure 100 is contained in the recess 223, a user may lift the first support region 133 and/or the second support region 135 out of the recess 223 through the recessing region(s) 225 on the body 200, such that the support structure 100 is transformed from the storage condition into the first supporting condition or the second supporting condition.

The portable electronic device having the support structure of the invention can provide two supporting conditions with one support structure via the combination of the first structural member and the second structural member rotating around the first axis away from the body and via the second structural member rotating around the second axis away from the body, such that a user may choose to use the portable electronic device in a lateral display manner or a vertical display manner. In addition, the portable electronic device with only one support structure can achieve two supporting conditions without equipping a plurality of support structures, such that the mechanism is simple, the process of manufacturing and packaging of the portable electronic device is simplified, and the weight of the whole portable electronic device is reduced. Moreover, in the storage condition, the fastening component can be disposed in the body, such that the whole support structure is contained in the recess and not extruded from the surface of the body. The fastening component and the support structure are not extruded from the body, therefore, the surface of the body remains flat, which makes the placement convenient and a good external appearance.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A portable electronic device, including:
a body; and a support structure pivotally connected to the body, including:
a first structural member pivotally connected to the body along a first axis; and a second structural member pivotally connected to the first structural member along a second axis, the second structural member includes a first support region and a second support region, wherein the first axis is substantially perpendicular to the second axis;
wherein, the combination of the first structural member and the second structural member rotates around the first axis towards or away from the body, the second structural member rotates around the second axis towards or away from the body, when the combination of the first structural member and the second structural member rotates around the first axis away from the body, an edge of the body and the first support region leans against a support surface, and when the second structural member rotates around the second axis away from the body with the first structure member remained attached to the body, the other edge of the body and the second support region leans against the support surface.

2. The portable electronic device according to claim 1, wherein the first structural member further includes a fastening region, the body further includes a fastening component, the fastening component engages with the fastening region to restrict the first structural member from rotating along the first axis with respect to the body.

3. The portable electronic device according to claim 1, wherein the body has a recess for containing the support structure, and a fastening component is disposed in the body and selectively penetrates an inner side wall of the recess to engage with the fastening region for fixing the first structural member in the recess.

4. The portable electronic device according to claim 1, wherein the second structural member further includes a connection region pivotally connected to the first structural member, there is a first angle between the extending direction of the second support region and the extending direction of the first support region, and there is a second angle between the extending direction of the connection region and the extending direction of the first support region.

5. The portable electronic device according to claim 4, wherein the first angle and the second angle are substantially 90 degrees.

6. The portable electronic device according to claim 4, wherein the extending direction of the first support region is parallel to the first axis, and the extending direction of the second support region is parallel to the second axis.

7. The portable electronic device according to claim 6, wherein the extending direction of the connection region is parallel to the extending direction of the second support region.

8. The portable electronic device according to claim 1, wherein the first structural member includes a first axial region and a second axial region, the first axial region has an end pivotally connected to the body, the other end of the first axial region is connected to an end of the second axial region, and the other end of the second axial region is connected to the second structural member.

9. The portable electronic device according to claim 1, wherein the second structural member is U-shaped.

10. The portable electronic device according to claim 1, further includes a display panel disposed on a side of the body, and the support structure is disposed on the other side of the body.

* * * * *